US008726509B2

(12) United States Patent
Tanaka et al.

(10) Patent No.: US 8,726,509 B2
(45) Date of Patent: May 20, 2014

(54) METHOD OF MANUFACTURING AN INK JET RECORDING HEAD OF LAMINATE STRUCTURE

(75) Inventors: Kumiko Tanaka, Kanagawa (JP); Michiaki Murata, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 561 days.

(21) Appl. No.: 12/626,976

(22) Filed: Nov. 30, 2009

(65) Prior Publication Data

US 2010/0071212 A1 Mar. 25, 2010

Related U.S. Application Data

(62) Division of application No. 11/057,963, filed on Feb. 15, 2005, now Pat. No. 7,658,468.

(30) Foreign Application Priority Data

Sep. 13, 2004 (JP) ................................ 2004-265990

(51) Int. Cl.

*B21D 53/76* (2006.01)
*B23P 17/00* (2006.01)
*H05K 3/20* (2006.01)

(52) U.S. Cl.

USPC ........................................... 29/890.1; 29/831

(58) Field of Classification Search

USPC ................ 29/890.1, 831, 832, 852, 846, 847; 347/44, 45, 46, 47, 48, 68, 70, 71, 72

See application file for complete search history.

(56) References Cited

U.S. PATENT DOCUMENTS

| | | | | |
|---|---|---|---|---|
| 4,578,686 | A | 3/1986 | Vollert | |
| 4,947,184 | A * | 8/1990 | Moynihan | 347/45 |
| 5,081,474 | A * | 1/1992 | Shibata et al. | 347/59 |
| 5,322,594 | A * | 6/1994 | Bol | 216/27 |
| 5,426,458 | A * | 6/1995 | Wenzel et al. | 347/45 |
| 6,345,424 | B1 * | 2/2002 | Hasegawa et al. | 29/25.35 |
| 6,447,107 | B1 | 9/2002 | Chino et al. | |
| 6,604,813 | B2 * | 8/2003 | Green | 347/47 |
| 6,715,860 | B2 * | 4/2004 | Watanabe | 347/68 |
| 6,802,596 | B2 * | 10/2004 | Higuchi et al. | 347/68 |
| 6,808,250 | B2 * | 10/2004 | Watanabe | 347/45 |
| 2003/0052949 | A1 * | 3/2003 | Watanabe | 347/68 |
| 2004/0032466 | A1 * | 2/2004 | Deguchi et al. | 347/67 |

FOREIGN PATENT DOCUMENTS

| | | |
|---|---|---|
| JP | 08-187867 | 7/1996 |
| JP | 2002-347247 | 12/2002 |
| JP | 2003-094648 | 4/2003 |
| JP | 2003-145751 | 5/2003 |
| JP | 2004-074809 | 3/2004 |

* cited by examiner

*Primary Examiner* — David Angwin
(74) *Attorney, Agent, or Firm* — Fildes & Outland, P.C.

(57) ABSTRACT

A method of manufacturing an ink jet recording head made of a laminate structure, in which plural members are laminated, includes making an ink channel including a nozzle by laminating the plural members including a nozzle plate having the nozzle; and performing a channel film forming process for forming a channel film having an ink resistance, the channel film covering an entire inner wall of the ink channel formed in the plural members including the nozzle plate and the nozzle.

12 Claims, 12 Drawing Sheets

ETCHING ACTIVATION

FILLING METALLIC PARTICLE LIQUID

DISCHARGING AND HEATING METALLIC PARTICLE LIQUID

FILLING METALLIC PARTICLE LIQUID

APPLYING VOLTAGE

DISCHARGING AND HEATING METALLIC PARTICLE LIQUID

METHOD OF MANUFACTURING AN INK JET RECORDING HEAD OF LAMINATE STRUCTURE

CROSS-REFERENCE TO RELATED APPLICATIONS

This application is a division of U.S. application Ser. No. 11/057,963 filed Feb. 15, 2005, now U.S. Pat. No. 7,658,468, which claims priority under 35 USC 119 from Japanese Patent Application No. 2004-265990, the disclosure of which is incorporated by reference herein.

BACKGROUND OF THE INVENTION

1. Technical Field

The present invention relates to an ink jet recording head, which is used in an ink jet recording apparatus for ejecting ink droplets so as to record an image, and an ink jet recording head fabricating method for fabricating the ink jet recording head.

2. Description of the Related Art

Selection of a member having an ink resistance has been conventionally indispensable for preventing any corrosion caused by a contact with ink in the field of development of an ink jet recording head. However, some of ink jet recording heads have been constituted by laminating plural members in recent years, and therefore, it has become difficult to use only the members having the ink resistance. In addition, joining deficiency may occur at a joint between the laminated members since the plural members are laminated.

In view of this, a corrosion preventing film having the ink resistance is formed at a portion in contact with the ink, so as to prevent any corrosion of a member poor in ink resistance caused by the contact with the ink in techniques disclosed in Japanese Patent Application Laid-Open (JP-A) No. 2003-145,751, No. 2002-347,247, No. 2003-94,648 and No. 2004-74,809. Surely, the ink resistance of an ink channel can be secured, and further, the members constituting the ink jet recording head can be freely selected within a wider range.

However, since the corrosion preventing film is formed at each of the plural members before the lamination of the members in the techniques disclosed in JP-A Nos. No. 2003-145,751, No. 2002-347,247, No. 2003-94,648 and No. 2004-74,809, the joining deficiency between the laminated members cannot be eliminated, thereby raising problems of reduction of strength of the ink jet recording head or insufficient application of a pressure required for ink ejection to the ink, that is, a so-called pressure leakage.

SUMMARY OF THE INVENTION

The present invention has been accomplished to solve the above-described problems experienced in the related art. An ink jet recording head of a laminate structure, which can solve the problems of reduction of strength or a pressure leakage caused by joining deficiency between members to be laminated, and a method of manufacturing such an ink jet recording head are in need.

A first aspect of the invention relates to an ink jet recording head of a laminate structure, in which plural members are laminated. The ink jet recording head includes an ink channel constituted of the plural members, and a channel film having an ink resistance, for continuously covering at least one portion of joints between the plural members on an inner wall constituting the ink channel across the members constituting the joints.

A second aspect of the invention relates to a method of manufacturing an ink jet recording head of a laminate structure, in which several members are laminated. The method includes making an ink channel by laminating the plural members, and performing a channel film forming process for forming a channel film having an ink resistance, which continuously covers an inner wall of the ink channel.

BRIEF DESCRIPTION OF THE DRAWINGS

Embodiments of the present invention will be described in detail based on the following figures.

DETAILED DESCRIPTION OF THE INVENTION

A description will be given below of preferred embodiments according to the present invention in reference to the attached drawings.

Figure 1:
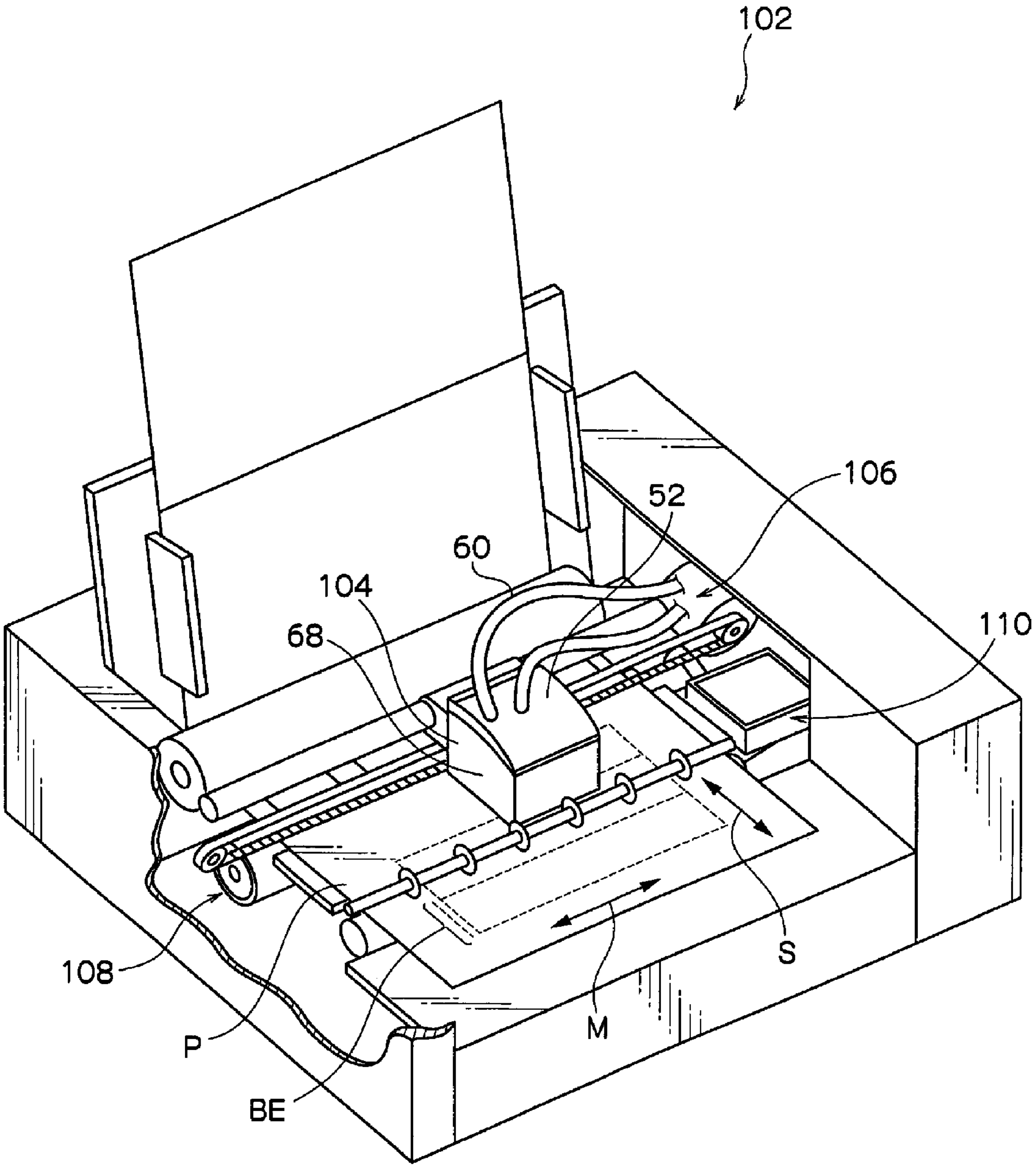
FIG. 1 is a perspective view schematically showing an ink jet recording apparatus.

As shown in FIG. 1, an ink jet recording apparatus 102 is constituted by including a carriage 104, on which a head case 52 is mounted, a main scanning mechanism 106 for scanning the carriage 104 in a main scanning direction M, a sub scanning mechanism 108 for scanning a recording sheet P serving as a recording medium in a sub scanning direction S, a maintenance station 110 and the like.

Figure 2:
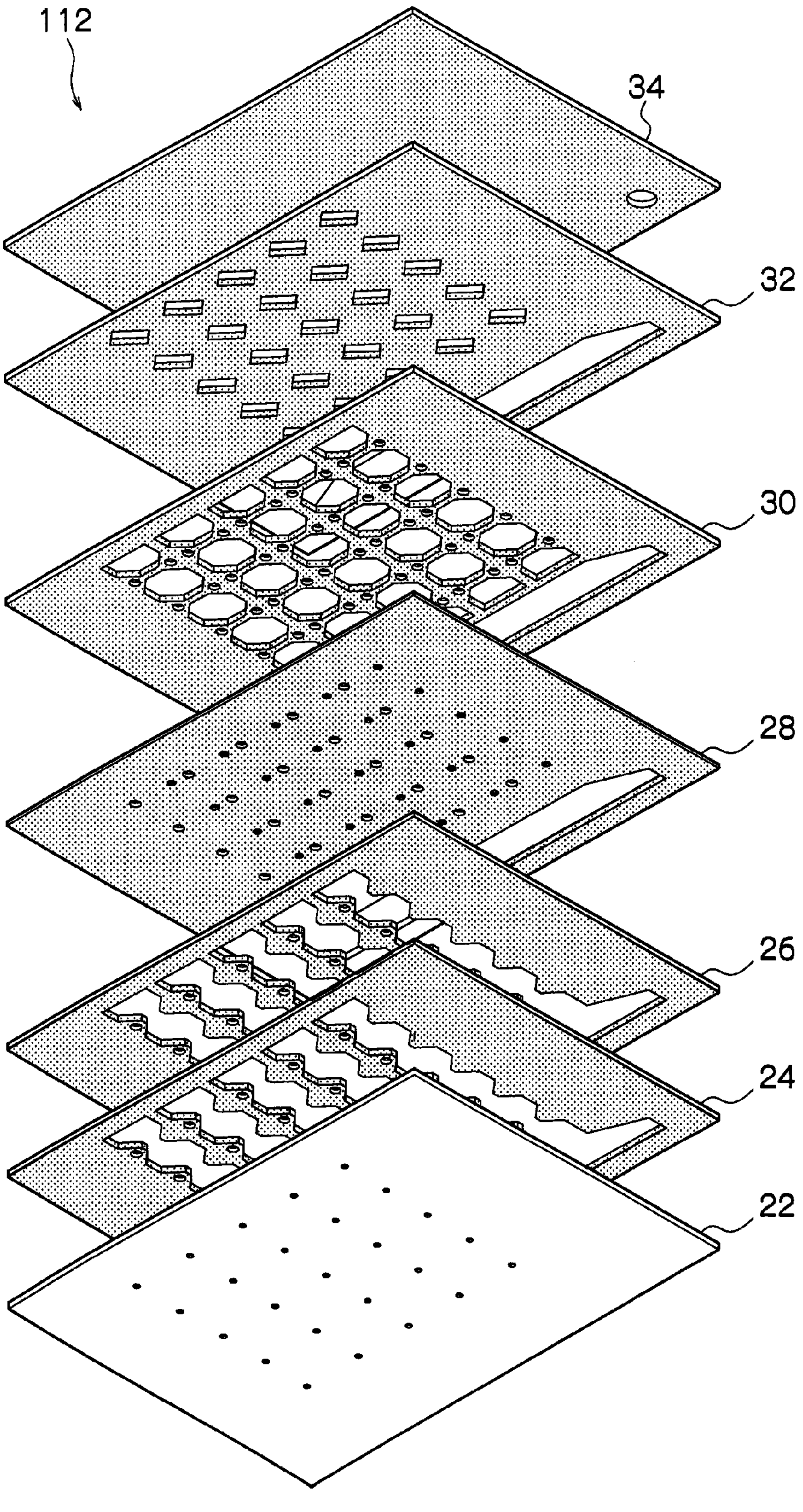
FIG. 2 is an exploded perspective view showing laminated members constituting an ink jet recording head.
Figure 3:
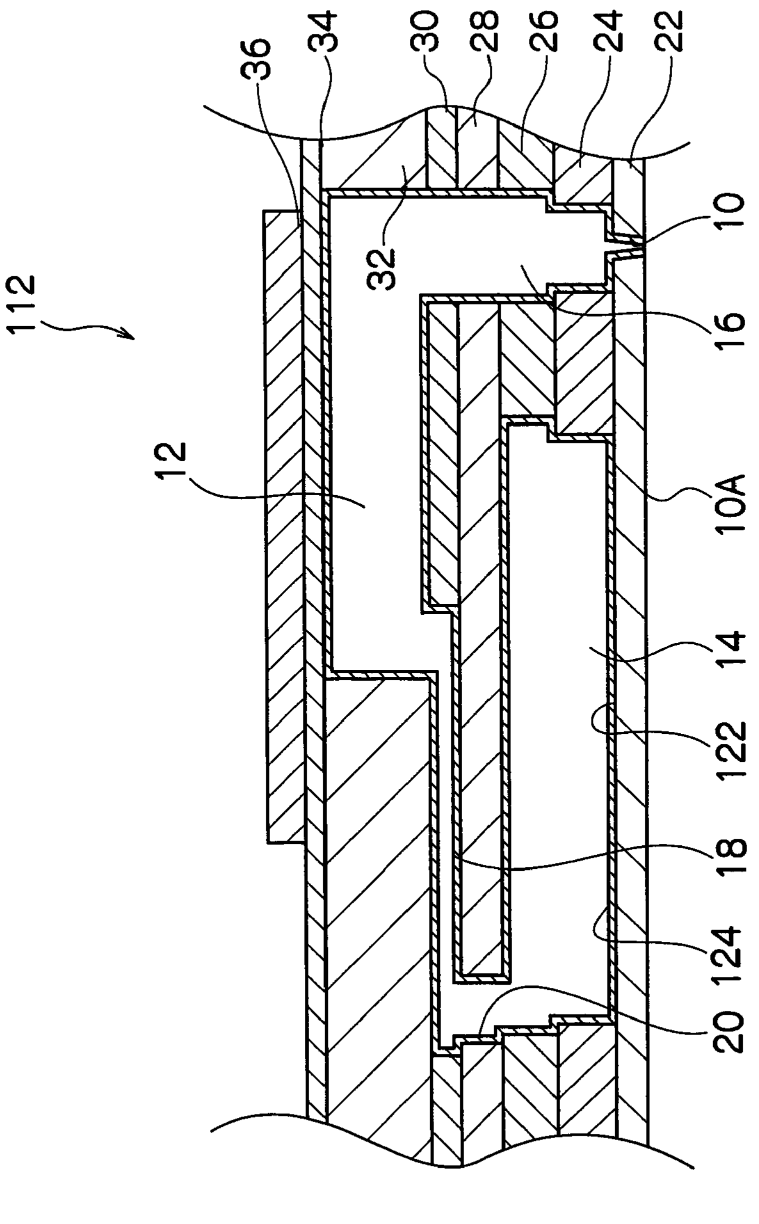
FIG. 3 is a cross-sectional view showing the configuration of a part of the ink jet recording head.

The head case 52 is provided with an ink jet recording head 112 for ejecting ink so as to record an image (see FIGS. 2 and 3). The head case 52 is placed on the carriage 104 in such a manner as to face to the recording sheet P on the ink ejection side of the ink jet recording head 112, and thus, records an image on a predetermined band region BE by ejecting ink droplets with respect to the recording sheet P while being moved in the main scanning direction M by the main scanning mechanism 106. Upon completion of one movement in the main scanning direction, the recording sheet P is transported in the sub scanning direction S by the sub scanning mechanism 108, and then, an image is recorded in a next band region BE while moving the carriage 104 again in the main scanning direction M. With the repetitive operations plural times, the image can be recorded on the entire recording sheet P.

As shown in FIG. 2, the ink jet recording head 112 is formed by laminating a nozzle plate 22, ink pool plates 24 and 26, a through plate 28, an ink supply path plate 30, a pressure chamber plate 32 and a vibrating plate 34 in order. These members constituting the ink jet recording head 112 are bonded to each other via an adhesive made of an epoxy resin or the like.

As shown in FIG. 3, inside of the ink jet recording head 112, an ink ejecting nozzle 10 is formed in the nozzle plate 22, and further, the ink pool plates 24 and 26 constitute a nozzle communication chamber 16 and a common ink channel 14. In the through plate 28 is formed an opening 20 between an ink supply path 18, which is formed at the ink supply path plate 30, and the common ink channel 14. Moreover, a pressure chamber 12 is defined in the pressure chamber plate 32. The ink ejecting nozzle 10, the nozzle communication chamber 16, the common ink channel 14, the opening 20, the ink supply path 18 and the pressure chamber 12, which are formed in the above-described manner, constitute a portion, through which ink passes and at which the ink is reserved, and thus, are comprehensively referred to as "an ink channel 120" hereinafter. In addition, a wall constituting the ink channel 120 is referred to as "an inner wall 122".

At the upper surface of the pressure chamber 12 is bonded the vibrating plate 34, onto which a piezoelectric element 36 is bonded. The piezoelectric element 36 is connected to a drive circuit, not shown, to be driven in response to a drive pulse to be applied.

The inner wall 122 constituting the ink channel 120 is coated with a channel film 124 for continuously covering the entire inner wall 122. The channel film 124 is made of a metal, a metallic alloy, a metallic compound, glass or the like, which has an ink resistance.

Figure 4A:
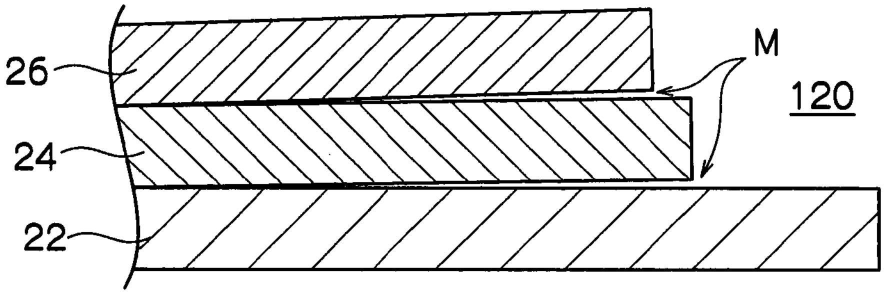
FIG. 4A is a view illustrating joining deficiency of a part of the members constituting the ink jet recording head.
Figure 4B:
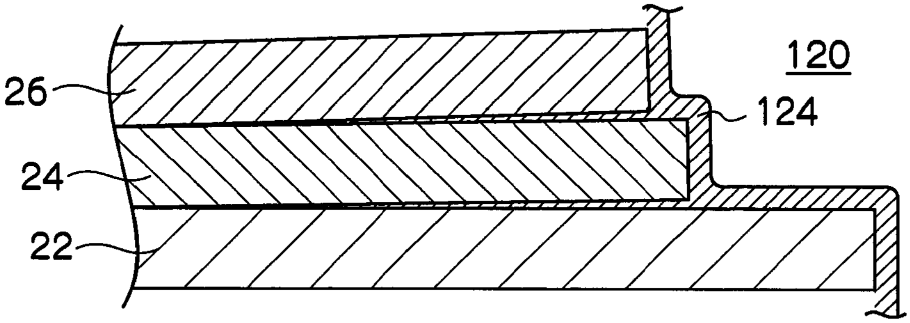
FIG. 4B is a view illustrating the state in which a joining deficient portion is covered with a channel film in the ink jet recording head shown in FIG. 4A.

In the ink jet recording head 112 such configured as described above, even if joining deficiency M is caused by the turn of a joint between the laminated members, as shown in FIG. 4A, since the channel film 124 is continuously formed on the inner wall 122 of the ink channel 120 (FIGS. 4A and 4B show an example in which the joining deficiency M is caused between the nozzle plate 22 and the ink pool plate 24 and between the ink pool plates 24 and 26), the inner wall 122 is flattened by covering the turned portion with the channel film 124 since the channel film 124 is formed across the joints, as shown in FIG. 4B. In this manner, it is possible to prevent any reduction of strength of the ink jet recording head 112, and further, to reduce a pressure leakage at the time of ink ejection.

Figure 5A:
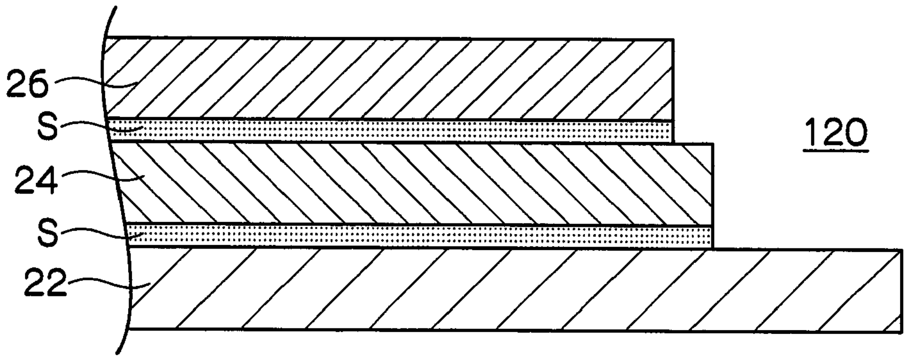
FIG. 5A is a view illustrating the state in which an adhesive at a joint is exposed at a part of the members constituting the ink jet recording head.
Figure 5B:
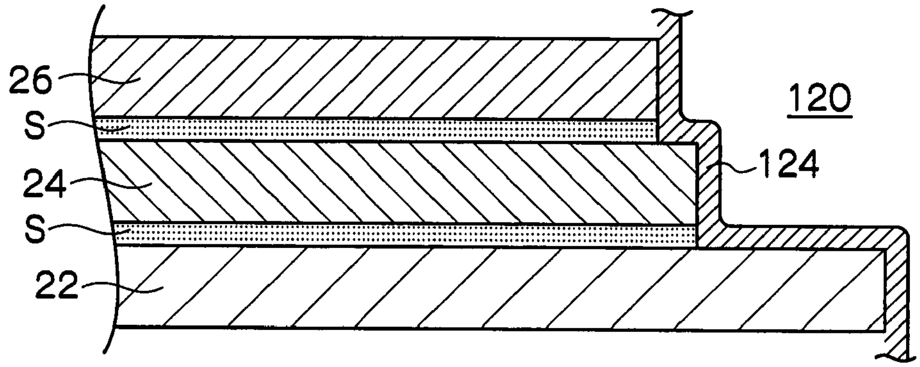
FIG. 5B is a view illustrating the state in which the adhesive at the joint is covered with the channel film in the ink jet recording head shown in FIG. 5A.

Furthermore, since the ink channel 120 is covered with the channel film 124 having the ink resistance, as shown in FIG. 5B, even if an adhesive S used in joining the laminated members is exposed on the ink channel 120, as shown in FIG. 5A, corrosion caused by the ink can be prevented even in the case where the adhesive S having a low ink resistance is used. As a consequence, it is possible to select a bonding method within a wide range.

Incidentally, although the channel film 124 is continuously formed on the entire inner wall 122 constituting the ink channel 120 in the preferred embodiment, at least one portion of the joints between the plural members constituting the inner wall 122 may be continuously covered with the channel film 124 across the plural members (for example, only the joint between the ink pool plates 24 and 26 may be covered with the channel film 124). Consequently, it is possible to produce the effects of the prevention of any reduction of the strength of the ink jet recording head 112, and further, of the reduction of the pressure leakage during the ink ejection.

Next, explanation will be made on a method for fabricating the above-described ink jet recording head 112.

First of all, the members constituting the ink jet recording head 112, that is, the nozzle plate 22, the ink pool plates 24 and 26, the through plate 28, the ink supply path plate 30, the pressure chamber plate 32 and the vibrating plate 34, are laminated in order, and are bonded to each other via the adhesive S. In this manner, the ink jet recording head 112 is assembled. The channel film 124 is formed on the inner wall 122 of the ink channel 120 of the assembled ink jet recording head 112. The channel film 124 is such formed as described below:

[First Channel Film Forming Method]

Figure 6A:
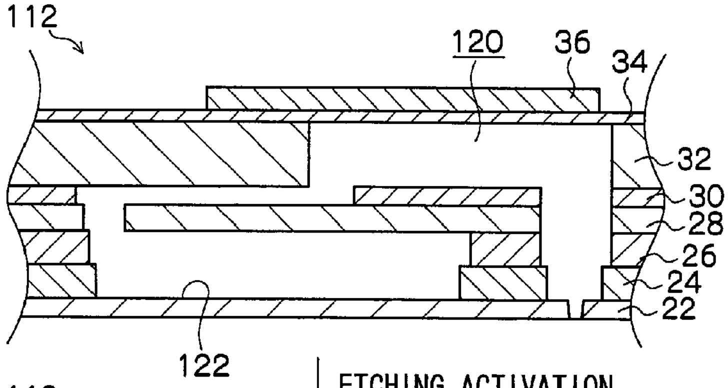
FIGS. 6A to 6D are views illustrating a process of forming a channel film on an ink channel in the ink jet recording head by a first channel film forming method.
Figure 6B:
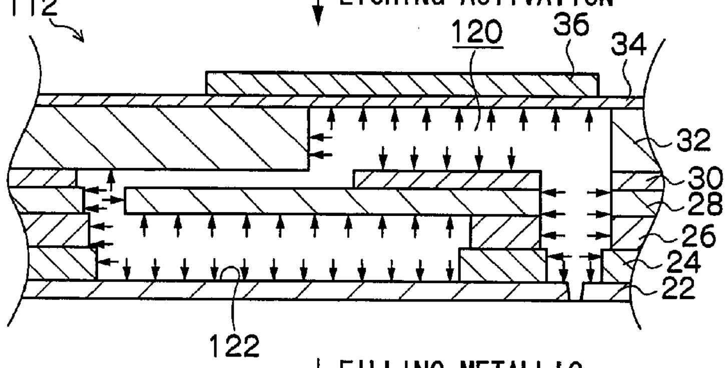
Figure 6C:
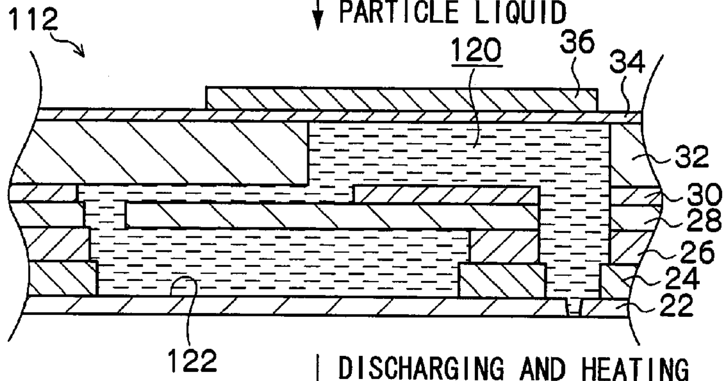

First, the surface of the inner wall 122 of the ink channel 120 of the assembled ink jet recording head 112 (see FIG. 6A) is etched with chromic acid or the like. Subsequently, the etched inner wall 122 is activated with colloid of titanium oxide or the like (see FIG. 6B), thereby enhancing adhesiveness of metallic particles, described later, onto the inner wall 122. Next, the ink channel 120 is filled with a metallic particle liquid incorporating the metallic particles (i.e., in a filling process, see FIG. 6C).

Here, Au, Pt, Ag, Cu, Ni, Cr, Rh, Pd, Zn, Co, Mo, Ru, W, Os, Ir, Fe, Mn, Ge, Sn, Ga, In and the like can be used as the metallic particles. The metallic particle liquid is prepared by dispersing the metallic particles in water or an organic solvent. In addition, the metallic particle having an average particle diameter of 100 nm or less is used.

Figure 6D:
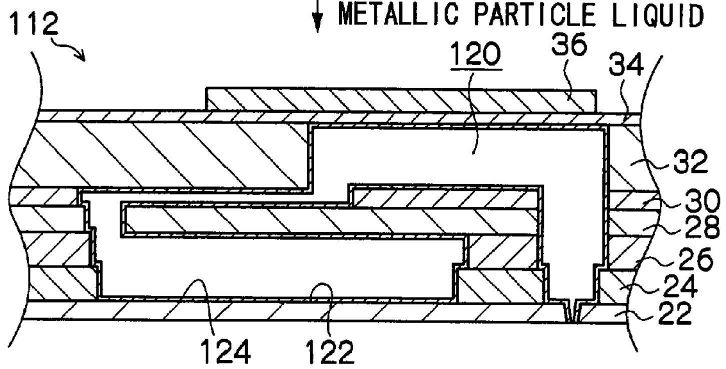

The ink jet recording head 112 is left for a predetermined period of time in the state in which the ink channel 120 is filled with the metallic particle liquid, and then, the metal is deposited on the inner wall 122 by electroless plating. After the lapse of the predetermined period of time, the filled metallic particle liquid is discharged from the ink channel 120. Thereafter, the deposited metal is fixed onto the inner wall 122 by heat treatment at temperatures from 100° C. to 150° C. (see FIG. 6D).

In the above-described manner, the channel film 124 can be continuously formed on the inner wall 122 of the ink channel 120.

[Second Channel Film Forming Method]

Figure 7A:
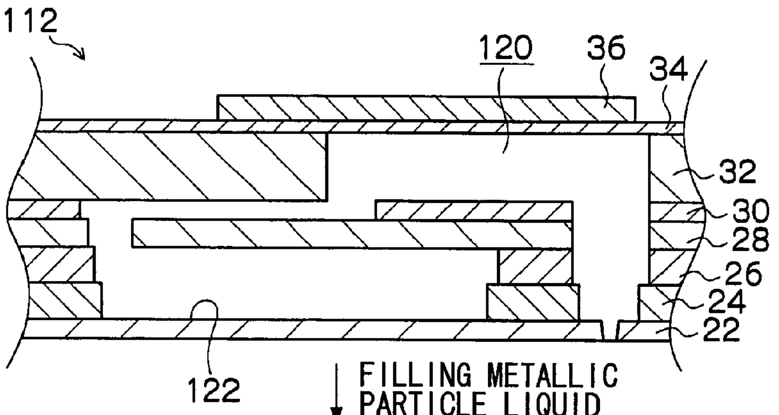
FIGS. 7A to 7D are views illustrating a process of forming a channel film on the ink channel in the ink jet recording head by a second channel film forming method.
Figure 7B:
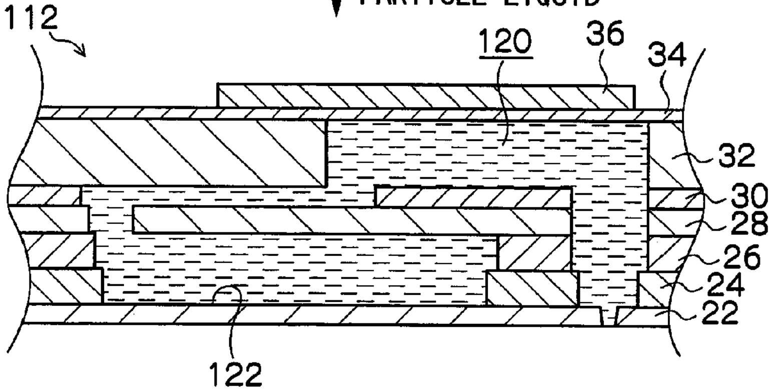

In the case where the ink jet recording head 112 is electrically conductive, the channel film 124 is formed as follows:

First, the ink channel 120 of the assembled ink jet recording head 112 (see FIG. 7A) is filled with the metallic particle liquid incorporating the metallic particles (i.e., in the filling process, see FIG. 7B).

Here, the same metallic particles and metallic particle liquid are used as those used in the first channel film forming method.

Figure 7C:
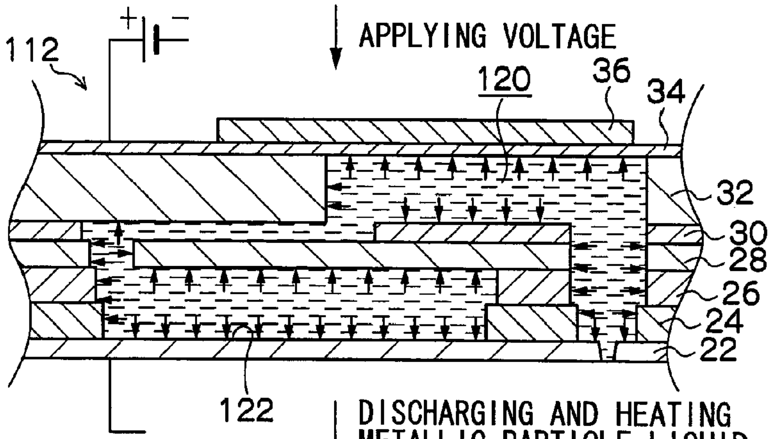
Figure 7D:
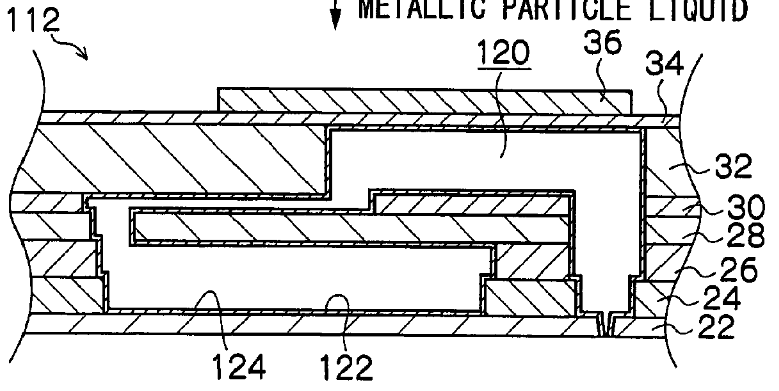

The ink jet recording head 112 is anodized with the application of a voltage in the state in which the ink channel 120 is filled with the metallic particle liquid (see FIG. 7C). As a consequence, the metallic particles incorporated in the metallic particle liquid are attracted onto the inner wall 122, to thus closely adhere onto the inner wall 122. After a lapse of a predetermined period of time, the filled metallic particle liquid is discharged from the ink channel 120. Thereafter, the deposited metal is fixed onto the inner wall 122 by heat treatment at temperatures from 100° C. to 300° C.

In the above-described manner, the channel film 124 can be continuously formed on the inner wall 122 of the ink channel 120.

[Third Channel Film Forming Method]

Subsequently, explanation will be made on a method for forming the channel film 124 by utilizing the temperature dependency of a saturation solubility.

Figure 8:
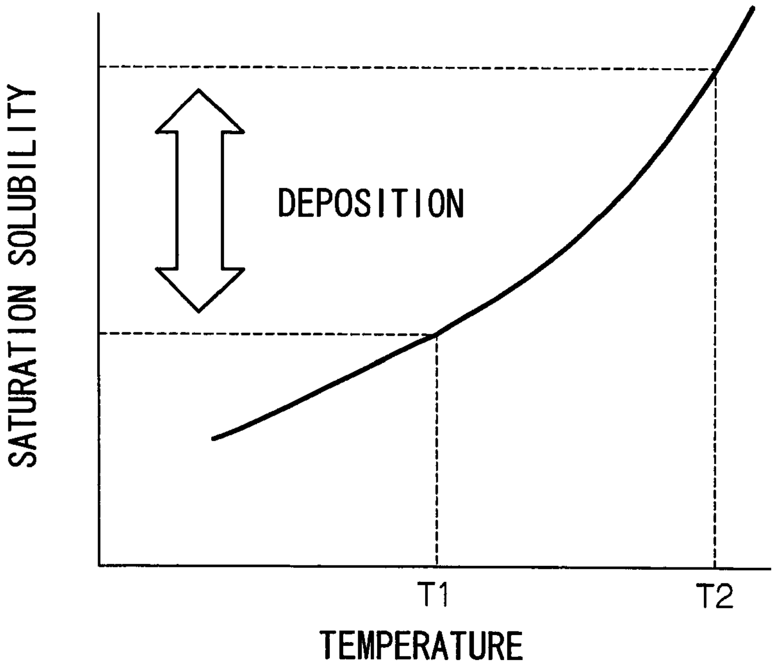
FIG. 8 is a diagram illustrating the relationship between a saturation solubility of metal with respect to a solvent and a temperature.

As illustrated in FIG. 8, the higher the temperature, the higher the saturation solubility of the metal with respect to the solvent. Consequently, for example, if the metal saturated at a temperature T2 is cooled down to a temperature T1, the metal is deposited by a quantity corresponding to a difference in saturation solubility between the temperatures T1 and T2. A description will be given below of the method for forming the channel film 124 by utilizing the above-described property.

Figure 9A:
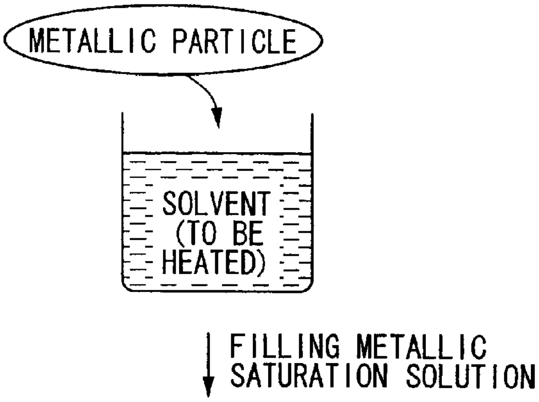
FIGS. 9A to 9D are views illustrating a process of forming a channel film on the ink channel in the ink jet recording head by a third channel film forming method.
Figure 9B:
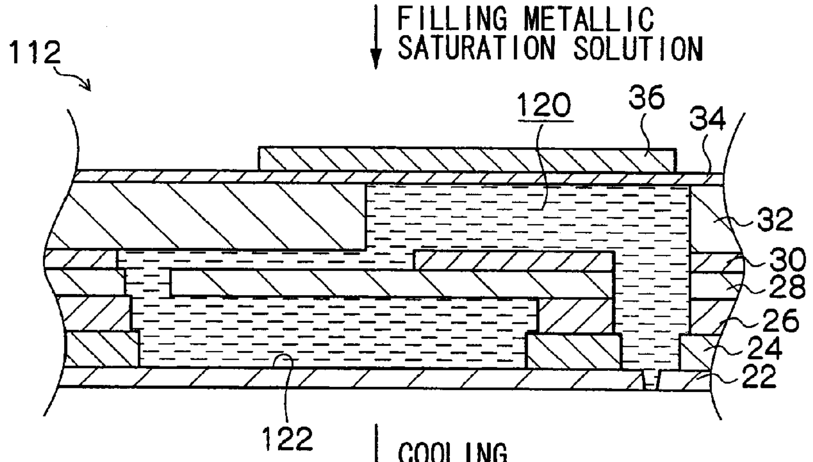
Figure 9C:
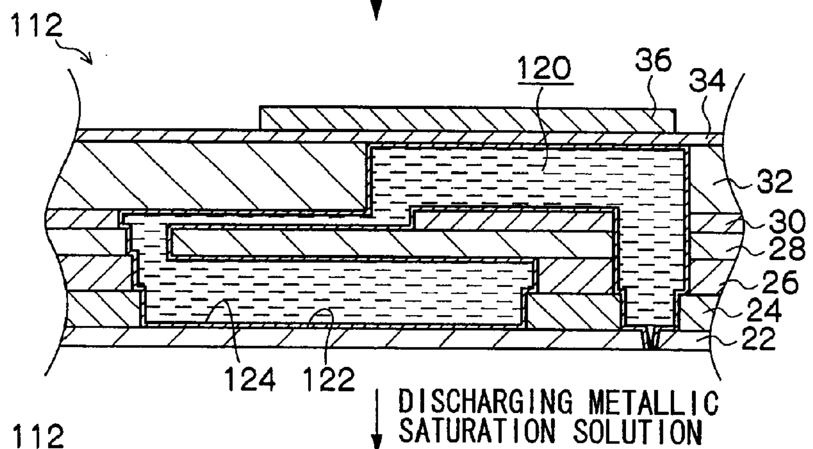
Figure 9D:
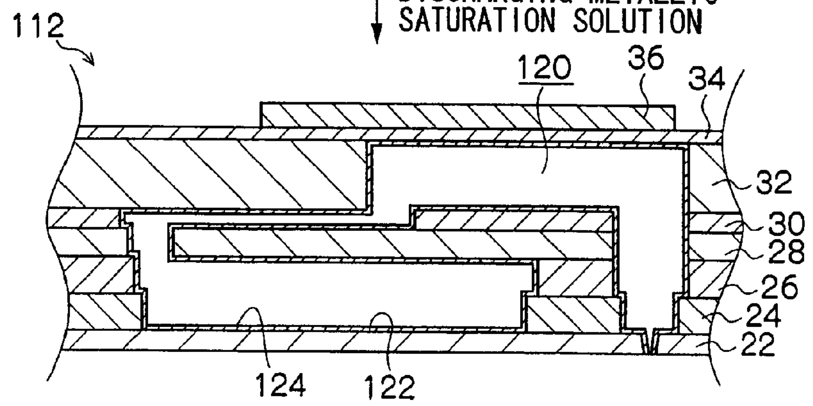

First of all, a metallic saturation solution is prepared by heating a solvent including halogen (X2), halide ($A^+X^-$) and an organic solvent up to the higher temperature T2, and then, dissolving the metallic particles in the resultant solvent till saturation (see FIG. 9A). Next, the ink channel 120 in the assembled ink jet recording head 112 is filled with the metallic saturation solution heated up to the higher temperature T2 (i.e., in the filling process, see FIG. 9B). Thereafter, the ink channel 120 is cooled down to the room temperature T1 (i.e., in a cooling process) in the state in which the metallic saturation solution is kept to be filled. As a consequence, the metal as dissolved substance is deposited by a quantity corresponding to a difference in saturation solubility between the higher temperature T2 and the room temperature T1, to thus adhere onto the inner wall 122 of the ink channel 120, thereby providing the channel film 124 (see FIG. 9C). Thereafter, the metallic saturation solution remaining inside of the ink channel 120 is discharged. The deposited metal, that is, the channel film 124 remains adhering onto the inner wall 122 of the ink channel 120.

In the above-described manner, the channel film 124 can be continuously formed on the inner wall 122 of the ink channel 120.

Incidentally, Au and the like are used as the above-described metal. The solvent includes 1 mmol of iodine ($I_2$) as the halogen, 1 mmol of tetraethyl ammonium iodide ($Et_4NI$) as the halide and 10 g of acetonitrile (AN) as the organic solvent in mixture.

[Fourth Channel Film Forming Method]

Next, explanation will be made on a method for forming the channel film 124 by growing $SiO_2$ in a liquid phase.

Figures 10A, 10B, 10C, 10D:
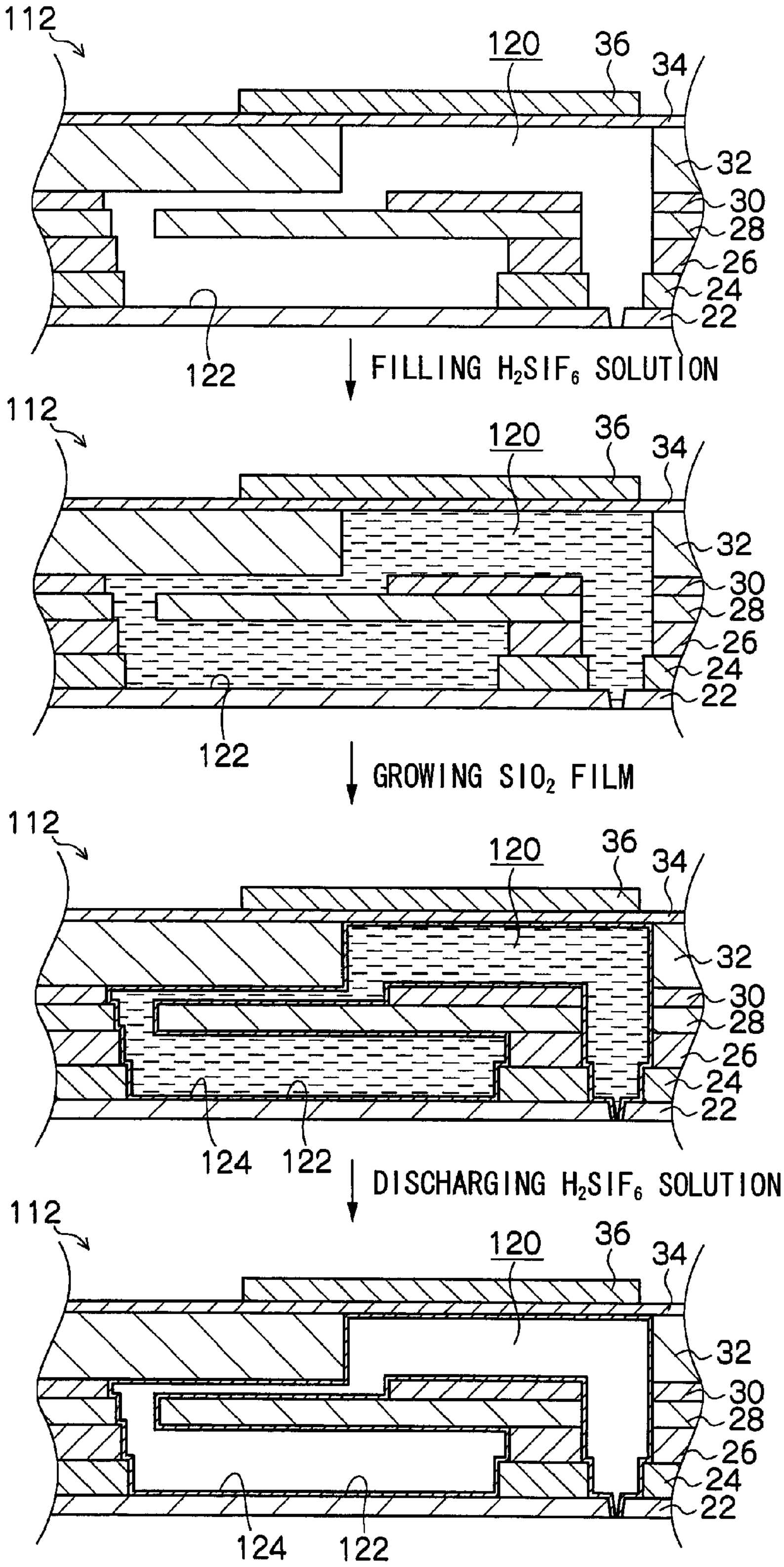
FIGS. 10A to 10D are views illustrating a process of forming a channel film on the ink channel in the ink jet recording head by a fourth channel film forming method.

First, the ink channel 120 of the assembled ink jet recording head 112 (see FIG. 10A) is filled with a silicofluoride solution (i.e., a solution of $H_2SiF_6$) (i.e., in the filling process). In this state, the ink jet recording head 112 is left for a predetermined period of time at the room temperature (see FIG. 10B). During this period of time, an $SiO_2$ film is grown on the inner wall 122 in accordance with the following reaction:

$$H_2SiF_6+H_2O\rightarrow 6HF+SiO_2$$

After the lapse of the predetermined period of time, the silicofluoride solution remaining inside of the ink channel 120 is discharged. The grown $SiO_2$ film remains on the inner wall 122 of the ink channel 120, and as a consequence, this film serves as the channel film 124.

In the above-described manner, the channel film 124 can be continuously formed on the inner wall 122 of the ink channel 120.

Figure 11A:
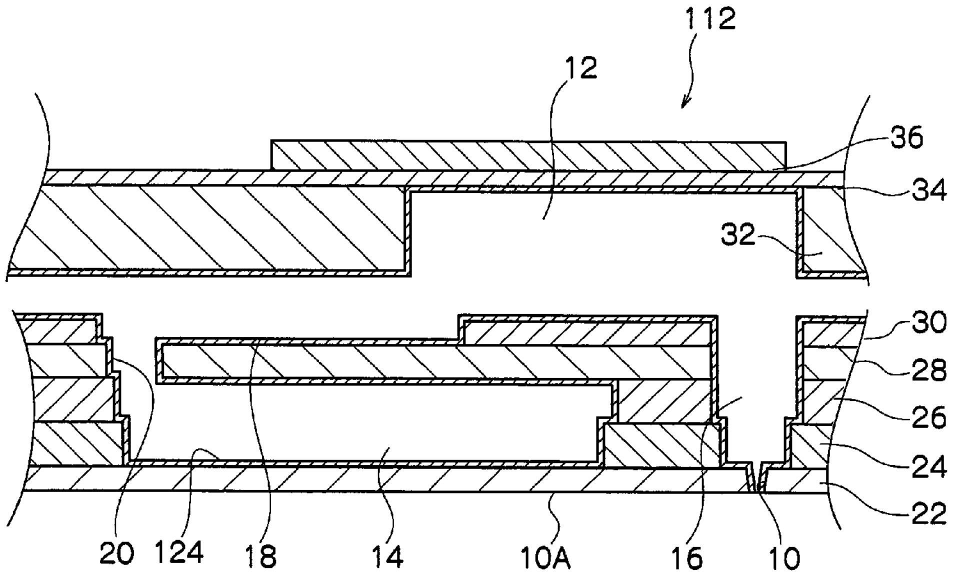
FIGS. 11A and 11B are cross-sectional views showing the ink jet recording head in the case where the channel film is formed before completion of assembly.
Figure 11B:
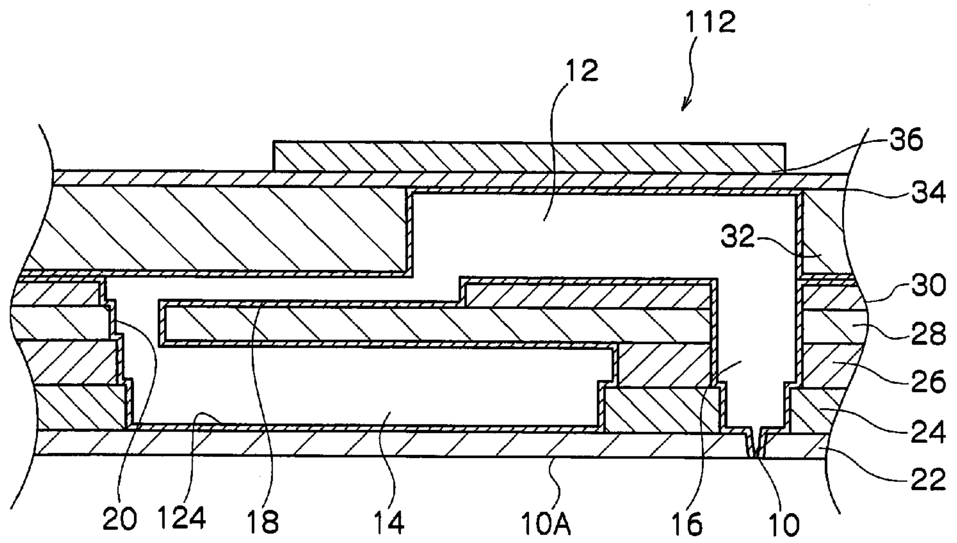

Incidentally, although the channel film 124 has been formed by filling the ink channel 120 with the metallic particle liquid after the completion of the assembly of the ink jet recording head 112 in the above-described first to fourth channel film forming methods, the channel film need not always be formed after the completion of the assembly. As shown in FIGS. 11A and 11B, the channel film 124 may be formed in the state of the lamination of the plural members constituting the ink jet recording head 112 (which are separated into a laminate consisting of the nozzle plate 22, the ink pool plates 24 and 26, the through plate 28 and the ink supply path plate 30 and a laminate consisting of the pressure chamber plate 32 and the vibrating plate 34 in FIG. 11A), and thereafter, the ink jet recording head 112 may be assembled. Even if the channel film 124 is formed in the above-described manner, the joints between the members are covered with the channel film 124, as shown in FIG. 11B. Thus, it is possible to produce the effects of the prevention of the reduction of the strength of the ink jet recording head 112 caused by the joining deficiency and of the reduction of a pressure leakage during the ink ejection.

Furthermore, the above-described channel film 124 can be applied to all of ink jet recording heads of a laminate structure in addition to the ink jet recording head 112 having the above-described configuration.

Figure 12:
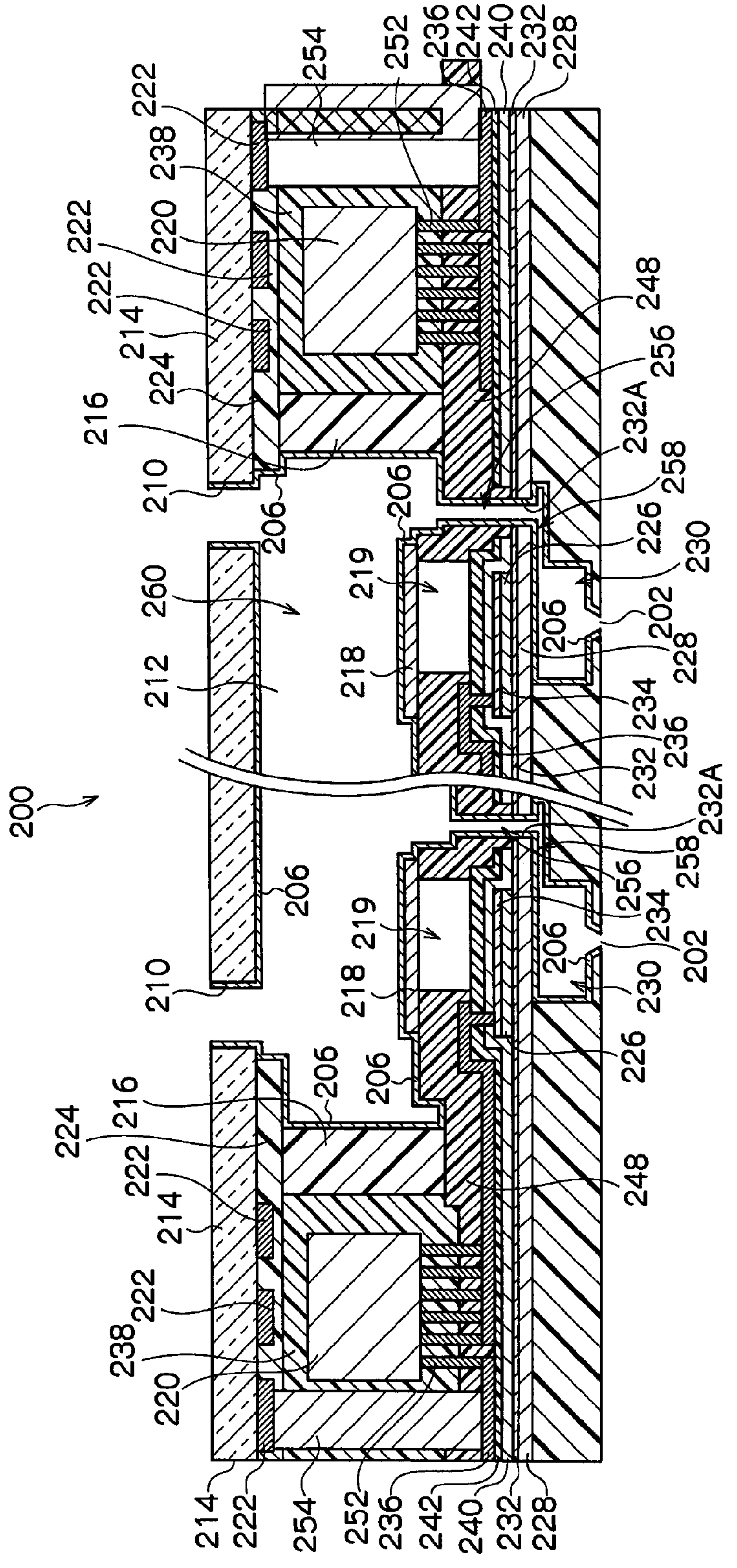
FIG. 12 is a cross-sectional view showing another configuration of a part of the ink jet recording head.

For example, an ink jet recording head 200 is configured such that plural members are laminated and various members are arranged inside of a laminate structure, as shown in FIG. 12.

The ink jet recording head 200 is provided with a top plate 214 constituting an ink supply port 210. Ink is supplied from an ink tank, not shown, from the ink supply port 210, and then, the ink is reserved in an ink pool chamber 212.

The volume of the ink pool chamber 212 is defined by the top plate 214 and a partition wall 216. The plural ink pool chambers 212 are bored in row at predetermined positions of the ink supply ports 210 and the top plates 214. Moreover, an air damper 218 made of a resin film for alleviating a pressure wave is disposed inside of the ink pool chamber 212 inward of the top plate 214 between the ink supply ports 210 formed in row.

The material of the top plate 214 may be selected from, for example, glass, ceramics, silicon, a resin and the like as long as the top plate 214 is an insulator having strength enough to serve as a supporter of the ink jet recording head 200. Additionally, on the top plate 214 are arranged metallic wiring 222 for energizing a drive IC 220, described later. The metallic wiring 222 is protectively covered with a resin film 224.

The partition wall 216 is molded with a resin, for partitioning the ink pool chamber 212 in a rectangular shape. Moreover, the ink pool chamber 212 is vertically separated from a pressure chamber 230 via a piezoelectric element 226 and a vibrating plate 228, which is flexibly deformed in a vertical direction by means of the piezoelectric element 226. In other words, the piezoelectric element 226 and the vibrating plate 228 are interposed between the ink pool chamber 212 and the pressure chamber 230, so that the ink pool chamber 212 and the pressure chamber 230 are not aligned on the same horizontal plane.

The piezoelectric element 226 is bonded to the upper surface of the vibrating plate 228. The vibrating plate 228 has elasticity in a vertical direction, and therefore, the vibrating plate 228 is flexibly deformed (displaced) in the vertical direction when the piezoelectric element 226 is energized (that is, when a voltage is applied). At the lower surface of the piezoelectric element 226 is arranged a lower electrode 232 having one polarity; in contrast, at the upper surface of the piezoelectric element 226 is arranged an upper electrode 234 having the other polarity. To the upper electrode 234 is electrically connected the drive IC 220 via a metallic wiring 236.

Additionally, the piezoelectric element 226 is protectively covered with a low water permeable insulating film 240. Furthermore, the upper surface of the low water permeable insulating film 240 is protectively covered with a resin film 242. Moreover, the metallic wiring 236 is also protectively covered with a resin protective film 248.

The upper portion of the piezoelectric element 226 is protectively covered with the resin film 242, but is not covered with the resin protective film 248. With this configuration, the piezoelectric element 226 and the vibrating plate 228 can be prevented from being displaced since the resin film 242 is a resin layer having flexibility. In addition, the air damper 218 made of the resin for alleviating the pressure wave is disposed at the upper surface of the resin protective film 248 in such a manner as to face to the piezoelectric element 226. Consequently, a separation chamber 219 surrounded by the resin protective film 248, the air damper 218 made of a resin film and the resin film 242 is defined at the upper portion of the piezoelectric element 226.

The drive IC 220 is arranged outside of the ink pool chamber 212 defined by the partition wall 216 and between the top plate 214 and the vibrating plate 228, from which the drive IC 220 cannot be exposed. As a consequence, the ink jet recording head 200 can be miniaturized.

Moreover, the surroundings of the drive IC 220 are sealed with a resin material 238, and further, plural bumps 252 are projected in a predetermined height at the lower surface of the drive IC 220. The bump 252 is connected to the metallic wiring 236. Outside of the drive IC 220 is disposed a bump 254. The bump 254 is adapted to connect the metallic wiring 222 and the metallic wiring 236 to each other.

A nozzle 202 for ejecting ink droplets is disposed at a predetermined position in one-to-one correspondence to the pressure chamber 230. The pressure chamber 230 and the ink pool chamber 212 avoid the piezoelectric element 226, and further, are connected to each other by the communication between an ink supply path 256 passing through a through hole 232A bored at the vibrating plate 228 and another ink supply path 258 extending from the pressure chamber 230 in a horizontal direction.

A channel film 206 is formed at each of portions in contact with the ink (i.e., an ink channel 260) in the ink jet recording head 200 having the above-described configuration. The channel film 206 is continuously configured as a series of layers, to thus cover a portion exposed to the ink channel 260 in each of the above-described members and a portion exposed to the ink channel 260 at each of the joints between the members.

Also in the ink jet recording head 200 having the above-described configuration, the inner wall of the channel is covered with the continuously formed channel film 206. Consequently, a joining deficient portion can be covered with the channel film 124 even if joining deficiency occurs at the joint between the members. Thus, it is possible to prevent the reduction of the strength of the ink jet recording head 200 caused by the joining deficiency and reduce the pressure leakage during the ink ejection.

Moreover, since the channel film 206 is comprehensively formed on the inner wall of the channel, the ink jet recording head 200 per se can be reduced in thickness in comparison with the case where an ink resistant film is independently formed on each of the members.

The features of the invention are summed up below. The joining deficiency possibly occurs at the joint between the members in the conventional ink jet recording head of the laminate structure having the plural members laminated thereon. In particular, in the case where many pieces of plates are laminated, there may be generated a portion which is difficult to be pressurized at the time of joining due to the structure of the ink channel. The joining deficiency at such a portion may produce the problems of the reduction of the strength of the ink jet recording head or the pressure leakage during the ink ejection.

In view of this, according to the invention, at least one joint on the inner wall of the ink channel constituted of the plural members is continuously covered with the channel film having the ink resistance across the plural members constituting the joint. Thus, the joining deficient portion between the plural members is covered with the channel film, thereby preventing any reduction of the strength of the ink jet recording head, which may be caused by the joining deficiency. Furthermore, the inner wall of the ink channel at the joint is flattened, so that the pressure leakage also can be reduced during the ink ejection.

Incidentally, the ink channel according to the invention includes all of the portions in contact with the ink in the ink jet recording head. Namely, it includes not only the passage of the ink but also the inside of the ink supply port or the ink ejection port, the ink reserving portion and the pressure chamber, in which the pressure is applied to the ink.

The channel film in the ink jet recording head according to the invention may be formed in such a manner as to continuously cover the entire inner wall constituting the ink channel.

With the above-described configuration, all of the joints are covered with the channel film, thereby securely preventing the reduction of the strength of the ink jet recording head, and further, preventing the pressure leakage during the ink ejection.

Moreover, the channel film in the ink jet recording head according to the invention may be formed by including at least one of metal, a metallic alloy and a metallic compound, which have an ink resistance.

The above-described metals include gold, platinum, silver, iron, copper, nickel, cobalt and the like.

The channel film excellent in ink resistance can be constituted by forming the channel film with any of the above-described metals.

In the ink jet recording head fabricating method according to the invention, first, the ink channel is constituted by laminating the plural members. The ink channel may be constituted by laminating all of the members constituting the ink jet recording head or a part of the members. Thereafter, there is formed the channel film having the ink resistance for continuously covering the inner wall of the ink channel. Consequently, the channel film can be continuously constituted at the joint on the ink channel, unlike the case where the members are laminated after the ink resistant film is formed on the ink channel. Thus, the joining deficient portion is covered with the channel film, thereby preventing any reduction of the strength of the ink jet recording head, which may be caused by the joining deficiency. Furthermore, the inner wall of the ink channel at the joint is flattened, so that the pressure leakage during the ink ejection can be reduced.

In the ink jet recording head fabricating method according to the invention, the channel film forming process may include filling a metallic particle liquid incorporating metallic particles therein into the ink channel, and discharging the metallic particle liquid from the ink channel after a lapse of a predetermined period of time.

In this manner, the metallic particle liquid is filled into the ink channel, and thereafter, is discharged, so that the channel film can be formed by allowing the metal to adhere to the ink channel.

Moreover, in the ink jet recording head fabricating method according to the invention, the channel film forming process may include activating the inner wall of the ink channel before the filling.

In this manner, the adhesiveness of the metal onto the inner wall can be enhanced by activating the inner wall of the ink channel before the metallic particle liquid is filled.

Additionally, in the ink jet recording head fabricating method according to the invention, the inner wall of the ink channel may be conductive, wherein the channel film forming process further may include anodizing and depositing the inner wall of the ink channel for a predetermined period of time after the filling and before the discharging.

In this manner, the metal is adhesively attracted onto the inner wall of the ink channel by anodizing the inner wall of the ink channel.

In addition, in the ink jet recording head fabricating method according to the invention, the metallic particle liquid may be the metallic saturation solution including the metallic particles in a saturation state, wherein the method may further include the producing the metallic saturation solution by heating the solvent before the filling and cooling the metallic saturation solution after the filling and before the discharging.

In this manner, since the saturation solubility of the dissolved metal also is reduced when the heated metallic saturation liquid is cooled inside of the ink channel, the metal is deposited on the inner wall of the ink channel. Thus, the metal can be deposited on the inner wall of the ink channel without activating or anodizing the inner wall of the ink channel.

Furthermore, the ink jet recording head fabricating method according to the invention may further include heating the inner wall of the ink channel after the discharging.

In this manner, the deposited metallic particle can be fixed onto the inner wall of the ink channel by heating the inner wall of the ink channel after the discharging process.

As described above, according to the invention, the joining deficient portion between the plural members is covered with the channel film, thereby preventing any reduction of the strength of the ink jet recording head, which may be caused by the joining deficiency, and further, reducing the pressure leakage during the ink ejection.

What is claimed is:

1. A method of manufacturing an ink jet recording head made of a laminate structure, in which plural members are laminated, the method comprising:
- making an ink channel including a nozzle by laminating the plural members including a nozzle plate having said nozzle; and
- performing a channel film forming process for forming a channel film having an ink resistance, the channel film covering an entire inner wall of the ink channel formed in the plural members including the nozzle plate and the nozzle.

2. The method of claim 1, wherein the channel film forming process includes filling a liquid containing metallic particles into the ink channel, and discharging the metallic particle liquid from the ink channel after a lapse of a predetermined period of time.

3. The method of claim 2, wherein the channel film forming process includes activating the inner wall of the ink channel before the filling.

4. The method of claim 2, further comprising forming the inner wall of the ink channel in such a manner as to have conductivity, wherein the channel film forming process further includes anodizing and depositing the inner wall of the ink channel for a predetermined period of time after the filling and before the discharging.

5. The method of claim 2, further comprising preparing the metallic particle liquid as a metallic saturation solution including the metallic particles in a saturation state, producing the metallic saturation solution by heating a solvent before the filling, and cooling the metallic saturation solution after the filling and before the discharging.

6. The method of claim 2, further comprising heating the inner wall of the ink channel after the discharging.

7. A method of manufacturing an ink jet recording head made of a laminate structure, in which plural members are laminated, the method comprising:
- making an ink channel by laminating the plural members;
- performing a channel film forming process for forming a channel film having an ink resistance, the channel film covering an inner wall of the ink channel;
- the channel film forming process including filling a liquid containing metallic particles into the ink channel, and discharging the metallic particle liquid from the ink channel after a lapse of a predetermined period of time; and
- forming the inner wall of the ink channel in such a manner as to have conductivity, wherein the channel film forming process further includes anodizing and depositing the inner wall of the ink channel for a predetermined period of time after the filling and before the discharging.

8. The method of claim 7, wherein the channel film forming process includes activating the inner wall of the ink channel before the filling.

9. The method of claim 7, further comprising heating the inner wall of the ink channel after the discharging.

10. A method of manufacturing an ink jet recording head made of a laminate structure, in which plural members are laminated, the method comprising:
- making an ink channel by laminating the plural members;
- performing a channel film forming process for forming a channel film having an ink resistance, the channel film covering an inner wall of the ink channel;
- the channel film forming process including filling a liquid containing metallic particles into the ink channel, and discharging the metallic particle liquid from the ink channel after a lapse of a predetermined period of time; and
- preparing the metallic particle liquid as a metallic saturation solution including the metallic particles in a saturation state, producing the metallic saturation solution by heating a solvent before the filling, and cooling the metallic saturation solution after the filling and before the discharging.

11. The method of claim 10, wherein the channel film forming process includes activating the inner wall of the ink channel before the filling.

12. The method of claim 10, further comprising heating the inner wall of the ink channel after the discharging.

* * * * *